United States Patent [19]

Fleischmann

[11] Patent Number: 5,194,830

[45] Date of Patent: Mar. 16, 1993

[54] SURFACE WAVE RESONATOR SYSTEM HAVING ADDITIONAL TRANSDUCER BETWEEN REFLECTORS

[75] Inventor: Bernd Fleischmann, Munich, Fed. Rep. of Germany

[73] Assignee: Siemens Matsushita Comp. GmbH & Co. KG, Fed. Rep. of Germany

[21] Appl. No.: 792,377

[22] Filed: Nov. 15, 1991

[30] Foreign Application Priority Data

Nov. 30, 1990 [EP] European Pat. Off. ........ 90123007.8

[51] Int. Cl.⁵ ............................................. H03B 5/00
[52] U.S. Cl. .................................. 331/107 A; 333/195; 310/313 D
[58] Field of Search ................... 331/107 A; 333/195; 310/313 R, 313 B, 313 C, 313 D

[56] References Cited

U.S. PATENT DOCUMENTS

| | | | |
|---|---|---|---|
| 3,970,970 | 7/1976 | Worley | 333/195 |
| 4,897,621 | 1/1990 | Masuda | 331/107 A |
| 5,021,699 | 6/1991 | Dufilie | 333/195 |

OTHER PUBLICATIONS

Herbert Matthews, "Surface Wave Filters", John Wiley and Sons, New York, London, Sidney, Toronto, 1977, pp. 412-440.

Martin et al., Zinc-oxide-on-silicon Surface Acoustic Wave Resonators, Appl. Phys. Lett. 37(8), Oct. 15, 1980, pp. 700-701.

Primary Examiner—Robert J. Pascal
Attorney, Agent, or Firm—Hill, Steadman & Simpson

[57] ABSTRACT

An SW resonator has a substrate of piezoelectric material. Two reflectors are applied onto the one substrate side. Input and output transducers are situated between the reflectors. The SW resonator is expanded to form an SW resonator having three electrical gates by arranging an additional transducer between the reflectors.

8 Claims, 3 Drawing Sheets

SURFACE WAVE RESONATOR SYSTEM HAVING ADDITIONAL TRANSDUCER BETWEEN REFLECTORS

BACKGROUND OF THE INVENTION

The invention is directed to a surface wave resonator comprising a substrate of piezoelectric material and comprising reflectors applied onto the one substrate side and between which input and output transducers, i.e. what are referred to as interdigital transducers, are situated.

A suitable substrate material is lithium niobate, lithium tantalate and, because of its temperature stability, particularly quartz. The Rayleigh or shear surface wave is employed dependent on crystal section or profile and propagation direction of the wave in the substrate.

The transducers are what are referred to as interdigital transducers and are composed of metallic electrode fingers arranged in alternating fashion and which respectively lie at bus electrodes or bus bars of different polarity. They are usually designed such that they only slightly reflect the surface wave in the range around the resonant frequency of the oscillator even though embodiments having partially reflecting, for example dispersive, transducers can offer advantages under certain circumstances.

The reflectors of the surface wave resonators are usually composed of individual strip-shaped, metallic elements directed perpendicularly to the surface waves — as seen in the propagation direction of the surface waves — and are arranged parallel to one another as well as in identical spacing and may also be potentially composed of corresponding grooves worked from the substrate (see, for example, "Surface Wave Filters", Herbert Matthews, John Wiley and Sons, New York, London, Sidney, Toronto, 1977, pages 412–440). Whereas the two outer reflectors R5 and R6 shown in the surface wave resonator 1 schematically shown in FIG. 2 reflect nearly all of the surface wave energy approaching these reflectors (which is important for achieving high quality), a middle reflector, i.e. a reflector arranged between the two transducers IDW5 and IDW6 shown in FIG. 2, is partially reflecting for incident surface wave energy when such an additional middle reflector is provided.

A transfer function as shown, for example, in FIG. 5 in which the amount and phase of a single-pole resonator according, for example, to FIG. 2, are shown, can be achieved by suitable dimensioning of the sub-structures of the transducers and reflectors, taking parasitic elements such as, for example, lead inductances and resistances, into consideration.

In oscillators that, due to their good properties and low costs, use a single-pole surface wave resonator 1 (see FIGS. 1 and 2 — referred to below in brief as SW resonator) for stabilizing the oscillatory frequency in the oscillator, the signal outfeed has previously occurred in a separate circuit part 4. There are several circuit alternatives that can assume this function of signal outfeed. They have various advantages and disadvantages; what they have in common is that they hardly suppress noise components such as, for example, the second harmonic of the useful signal which are present in the oscillator signal. A subsequent filtering of the outfed signal with a filter element 5 following the outfeed circuit 4 is therefore often necessary.

In the Pierce circuit which is frequently employed for oscillators and that is shown in a block circuit diagram in FIG. 1, the single-pole SW resonator — which, moreover, is shown in greater detail in FIG. 2 — is located in the feedback loop of an amplifier 3. The phase-setting element 2 serves the purpose of guaranteeing the phase conditions for the oscillation at the center frequency of the resonator. The overall phase must amount to a whole multiple of $2\pi$. The illustrated Pierce circuit has proven especially advantageous in the UHF region above 300 megahertz.

SUMMARY OF THE INVENTION

An object of the present invention is to create a SW resonator which solves the problems of stabilization of the oscillatory frequency in an oscillator and the problem of signal outfeed from the oscillator in an especially simple and distinguished way, and to simultaneously reduce the proportion of noise signals in the output signal.

Over and above this, the SW resonator should also be suitable for other applications, for example as a power divider and, in an inverse way, as an addition element for signals supplied to separate input transducers of the SW resonator.

For achieving this object, according to the invention, the SW resonator of the type indicated above is expanded to form an SW resonator having three electrical ports by providing an additional transducer between the reflectors.

When employed in the oscillator, this resonator, referred to in brief as an SW three-port resonator filter, combines the functions of frequency stabilization, signal outfeed and signal filtering allocated to separate elements in an oscillator circuit of FIG. 1, as well as the phase setting in a single component. This resonator can be manufactured with the standard manufacturing methods of SW filters, thus simplifying the manufacture thereof to a considerable extent.

At least one further reflector arranged between the transducers can be provided between the two reflectors of the SW resonator of the invention, this at least one further reflector reflecting only a fraction of the incident surface wave energy. The essentially reflection-free transducer regions adjoining at the two outer reflectors are thus advantageously selected of essentially the same size.

Even though weighted transducers can be utilized, the invention preferably employs unweighted interdigital transducers, i.e. transducers having constant, identical overlap of their electrode fingers which differ in polarity.

The SW resonator of the invention, and possible uses thereof, shall be set forth below with reference to the drawing figures.

DESCRIPTION OF THE PREFERRED EMBODIMENTS

Figure 1:
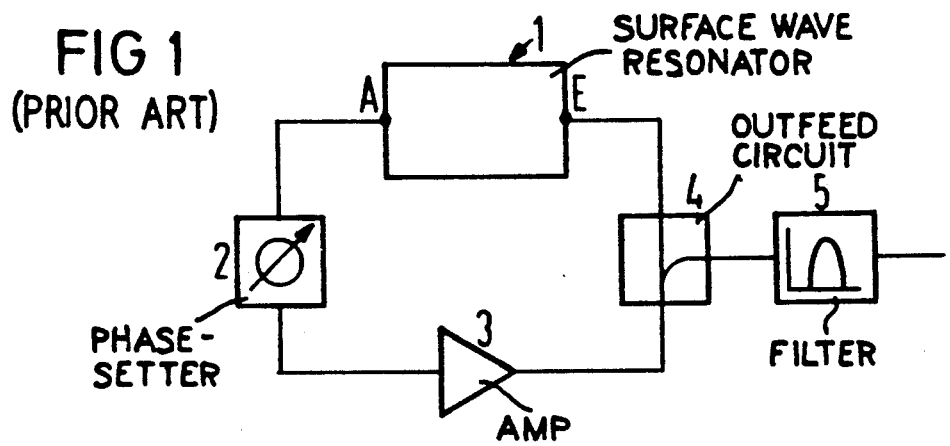
FIG. 1 is a block circuit diagram of a known oscillator in what is referred to as Pierce circuitry.
Figure 2:
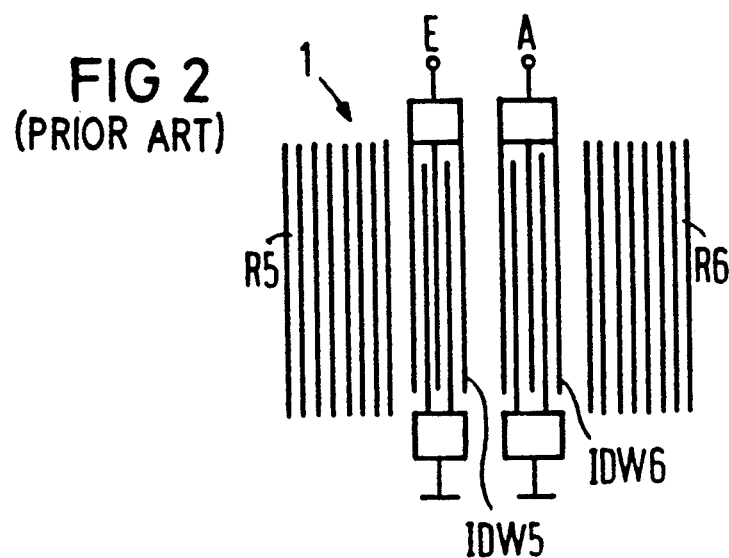
FIG. 2 is a plan view and schematic illustration of a known SW resonator utilized, for example, in the Pierce circuit of FIG. 1.

The SW resonator of FIG. 2 and the oscillator of FIG. 1 have already been adequately described at the outset, so that another explanation thereof is essentially superfluous.

Figure 3:
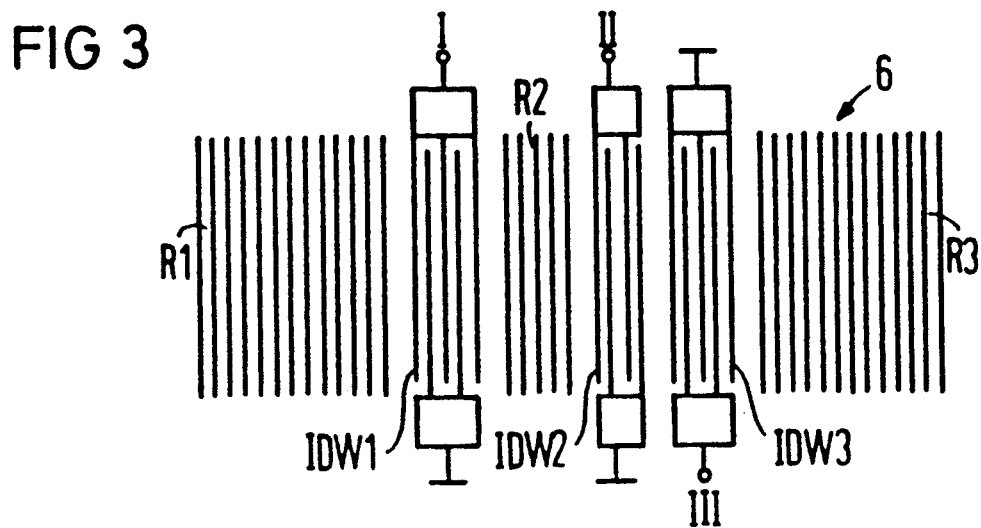
FIG. 3 is a two-pole SW resonator of the invention in the illustration of FIG. 2.

FIG. 3 shows a possible structure of the SW resonator 6 of the invention, this being composed of three interdigital transducers IDW1, IDW2, IDW3 having corresponding inputs I, II and III and, in its simplest embodiment, of two reflectors R1 and R3. Further reflectors, for example the reflector R2, can be arranged between these and between the interdigital transducers if necessary.

Figure 4:
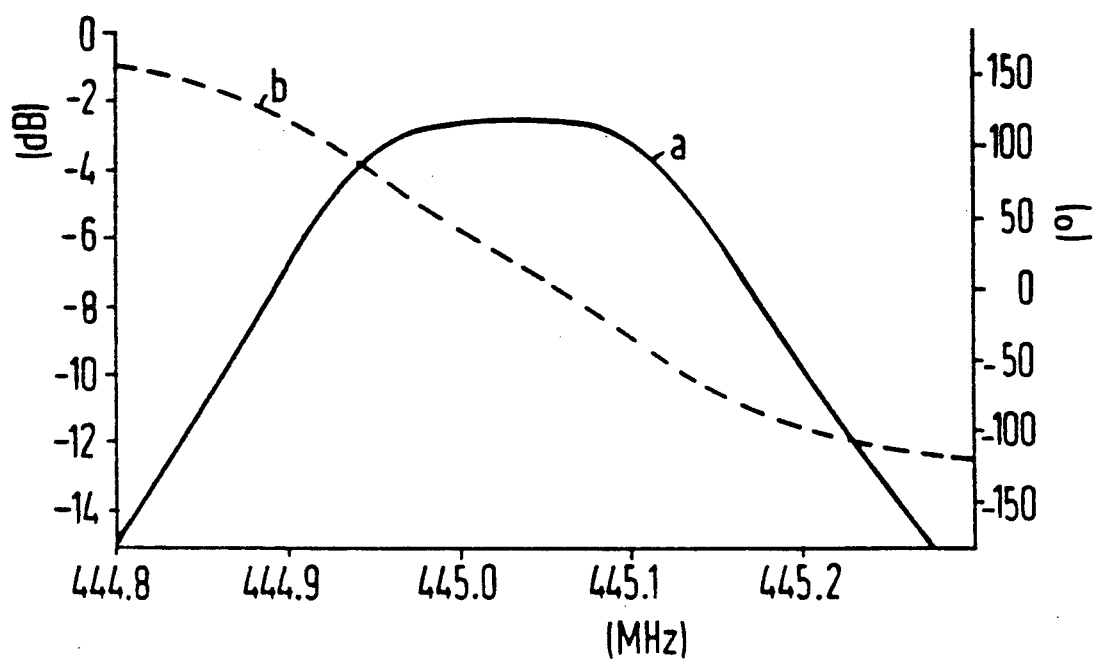
FIG. 4 shows the transfer function (amount and phase) of a two-pole SW resonator of FIG. 3.

The characteristic of an optimally coupled two-pole SW resonator — as shown in FIG. 4 wherein the curve of the amplitude and phase is shown over the illustrated frequency range (see curve a and curve b) — can be achieved for the transfer function from Point I to the Points II and III (see FIG. 3) on the basis of a corresponding dimensioning of the sub-structures of the interdigital transducers and of the reflectors that should be carried out taking parasitic elements such as, for example, lead inductances and resistances, into consideration.

Slight deviations in the dimensioning of the sub-structures of the transducers and reflectors as well as in the dimensioning of the parasitic elements from the optimum coupling can thus be permitted. They do not necessarily deteriorate the function of the SW resonator.

Figure 5:
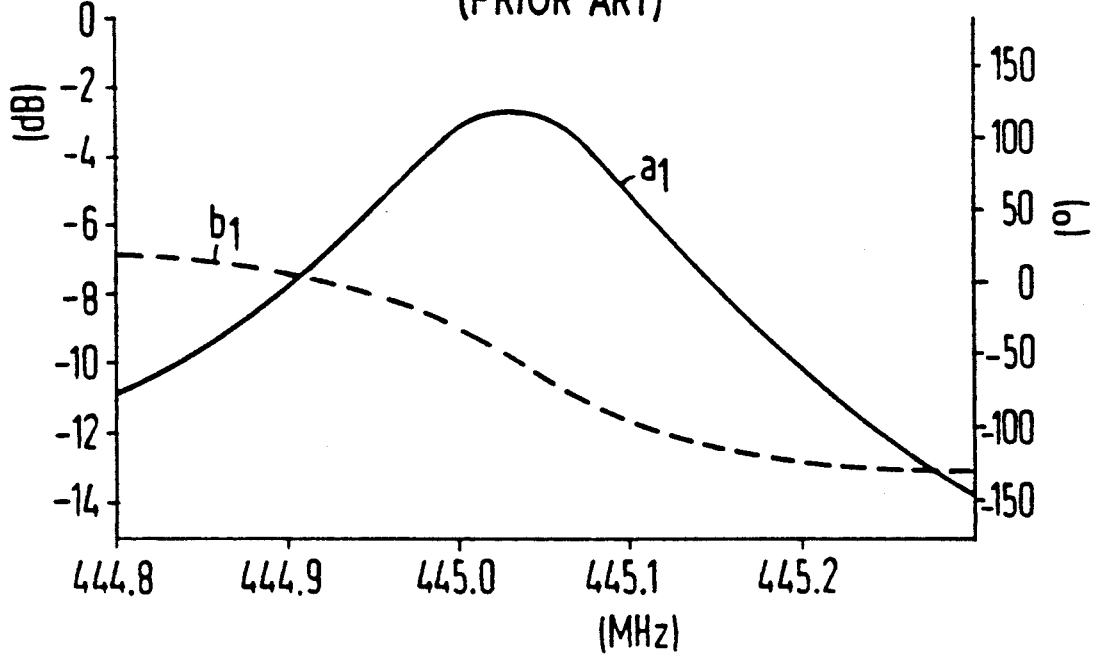
FIG. 5 is the transfer function (amount and phase) of a single-pole SW resonator of FIG. 2.

For comparison to the transfer characteristic of the SW filter 6 according to FIG. 3, FIG. 5 shows the transfer function of a single-pole SW resonator of FIG. 2. In this respect, see the curve of the amplitude and of the phase over the frequency reflected by the curves $a_1$ and $b_1$.

The critical differences between the SW resonators being compared that can be recognized based on these transfer functions are the greater bandwidth and the greater range of linear phase response of the two-pole SW resonator, given the practically same phase steepness and, thus of the same quality as well. This makes it possible to design the transfer function such that the phase at the rated oscillatory frequency of an oscillator has the value necessary to satisfy the oscillatory conditions, and that the attenuation only insignificantly deviates from the minimum. The necessity of, for example a phase-setting element 2 being required in the oscillator of FIG. 1 is thus eliminated. On the other hand, due to the linear phase response, a modulation of the oscillator frequency, if necessary, can be realized better with an electronic phase shifter than in a one-pole SW resonator.

Figure 6:
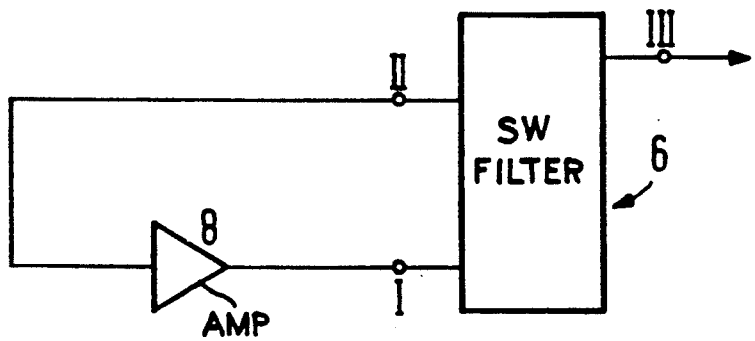
FIG. 6 illustrates the block circuit diagram of an oscillator equipped with a SW resonator of the invention.

In the block circuit diagram of an oscillator shown in FIG. 6 and having a SW resonator 6, for example according to FIG. 3, electrical power from the amplifier 8 is supplied to the resonator via the input I of the interdigital transducer IDW1. The signal generated in the interdigital transducer IDW2 thereby serves for the feedback of the amplifier 8, the oscillator circuit being thus closed. The signal outfeed occurs via the additional transducer IDW3. The output signal is thus filtered corresponding to the transfer function between the Points I and III. An additional filtering is thus superfluous, in most cases. Usually, as much power as possible will be outfed, this meaning that the interdigital transducer IDW2 is dimensioned such that only the power required for maintaining the oscillation is present at the input of the amplifier 8. The majority of the power given a corresponding dimensioning can then be outfed from the oscillator circuit via the interdigital transducer IDW3.

Another advantage of the SW resonator of the invention is that reactances of following circuits back to the oscillator circuit are minimized due to this type of signal outfeed.

Figure 7:
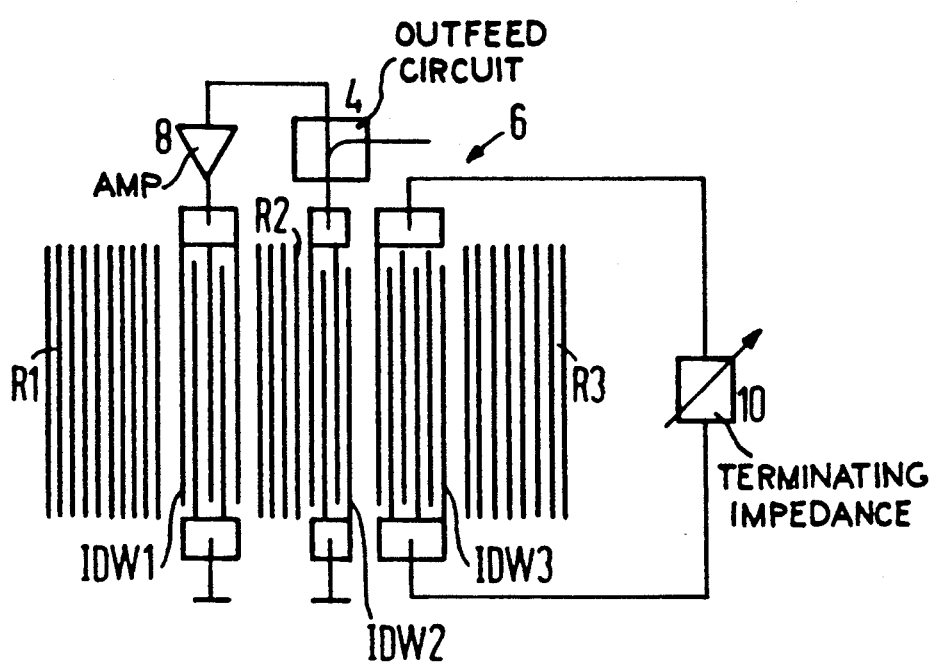
FIG. 7 is an oscillator having a SW resonator according to FIG. 3 whose oscillator frequency can be controlled with a variable terminating impedance.

When, as shown in FIG. 7, the interdigital transducer IDW3 is terminated by a terminating impedance 10 having variable impedance, then the oscillator frequency of the oscillator can be correspondingly controlled on the basis of this wiring. Since the interdigital transducer IDW3 is thus eliminated as an element for outfeed of the oscillator signal, the signal outfeed occurs via the circuit part 4 or via an additional interdigital transducer that is not shown in the drawing.

Figure 8:
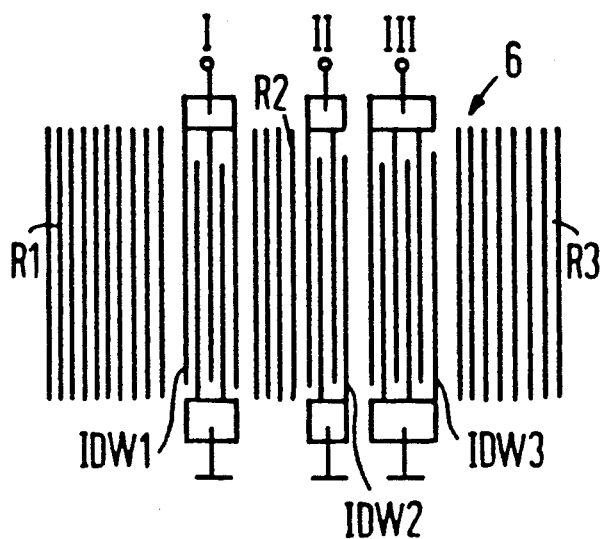
FIG. 8 is the SW resonator of FIG. 3 which, on the basis of an appropriate drive, can be utilized as a power divider or as addition element for signals.

The SW resonator of FIG. 3 can also serve as a power divider or as an addition element for signals — see FIG. 8.

In the former instance, for example, the transducer IDW1 is conceived as an input transducer, and the other transducers IDW2 and IDW3 are conceived as output transducers, whereby the power division occurs on the basis of an appropriate dimensioning, for example a corresponding length distribution of the output transducers.

When the SW resonator 6 is provided for the addition of signals, then the individual signals are supplied to separate transducers, for example the transducers IDW2 and IDW3, and are taken from the resonator via a single transducer, i.e. the transducer IDW1.

Although various minor changes and modifications might be proposed by those skilled in the art, it will be understood that I wish to include within the claims of the patent warranted hereon all such changes and modifications as reasonably come within my contribution to the art.

I claim as my invention:

1. A surface wave resonator, comprising:
   a substrate of piezoelectric material;
   two reflectors on one substrate side and input and output transducers situated between the reflectors;
   the surface wave resonator being expanded to form a surface wave resonator having three electrical gates by providing an additional transducer between the two reflectors, the additional being positioned directly adjacent the output transducer without a reflector therebetween; and
   at least one additional reflector means for reflecting only a fraction of incident surface waves being arranged between two the transducers.

2. A surface wave resonator according to claim 1 wherein the transducers adjoining the two other reflectors being substantially reflection-free and being selected of substantially a same size.

3. A surface wave resonator according to claim 1 wherein the transducers are unweighted interdigital transducers.

4. A surface wave resonator according to claim 1 wherein individual elements of the reflectors have a same width and have a same spacing relative to one another.

5. An oscillator, comprising:
a surface wave resonator formed of a substrate of piezoelectric material, two outer reflectors and one additional reflector on one substrate side, and three transducers between the outer reflectors, the additional reflector lying between two of the transducers, one of these two transducers lying directly adjacent the other transducer; and
two of the transducers being connected to an input and an output of an amplifier, respectively.

6. An oscillator according to claim 5 wherein one of the transducers provides an output of a frequency-stabilized signal from the oscillator.

7. An oscillator comprising:
a surface wave resonator formed of a substrate of piezoelectric material, two reflectors on one substrate side, and three transducers between the reflectors;
two of the transducers being connected to an input and an output of an amplifier, respectively; and
a terminating impedance means being connected to one of the transducers and being provided for controlling frequency of the oscillator by varying a terminating impedance of the terminating impedance means.

8. An oscillator, comprising:
a surface wave resonator formed of a substrate of piezoelectric material, two outer reflectors and one additional reflector on one substrate side, and three transducers between the outer reflectors; and
two of the transducers being connected to an input and an output of an amplifier, respectively.

* * * * *